United States Patent [19]
Kess

[11] Patent Number: 5,572,128
[45] Date of Patent: Nov. 5, 1996

[54] DOUBLE RESONANCE ANTENNA ARRANGEMENT FOR A NUCLEAR MAGNETIC RESONANCE APPARATUS

[75] Inventor: Helmut Kess, Erlangen, Germany

[73] Assignee: Siemens Aktiengesellschaft, Munich, Germany

[21] Appl. No.: 292,042

[22] Filed: Aug. 18, 1994

[30] Foreign Application Priority Data

Sep. 29, 1993 [DE] Germany ............... 43 33 182.3

[51] Int. Cl.⁶ ................................................. G01R 33/32
[52] U.S. Cl. ............................................. 324/318; 324/322
[58] Field of Search ........................... 324/318, 322, 324/314; 128/653.5

[56] References Cited

U.S. PATENT DOCUMENTS

| | | | |
|---|---|---|---|
| 4,506,224 | 3/1985 | Krause | 324/319 |
| 4,780,677 | 10/1988 | Nissenson et al. | 324/322 |
| 4,799,016 | 1/1989 | Rezvani | 324/318 |
| 5,038,105 | 8/1991 | Codrington et al. | 324/318 |
| 5,057,778 | 10/1991 | Rath | 324/318 |
| 5,075,624 | 12/1991 | Bezjak | 324/318 |
| 5,144,240 | 9/1992 | Mehdizadeh et al. | 324/318 |
| 5,166,621 | 11/1992 | Codrington et al. | 324/322 |
| 5,202,635 | 4/1993 | Srinivasan et al. | 324/322 |
| 5,221,901 | 6/1993 | Decke et al. | 324/318 |
| 5,321,360 | 6/1994 | Mansfield | 324/322 |
| 5,365,173 | 11/1994 | Zou et al. | 324/318 |

FOREIGN PATENT DOCUMENTS

| | | | |
|---|---|---|---|
| 0579473 | 1/1994 | European Pat. Off. | 324/318 |
| 6242202 | 9/1994 | Japan | 324/318 |
| 2245364 | 1/1992 | United Kingdom | 324/318 |

OTHER PUBLICATIONS

"Double–Tuned Resonator Designs for NMR Spectroscopy", Hecke et al., J. Mag. Res., vol. 84 (1989) pp. 170–176.

"Design and Construction of a Simple Double–Tuned, Single–Input Surface–Coil Probe", Gonnella et al., J. Mag. Res., vol. 85, (1989) pp. 24–34.

Primary Examiner—Sandra L. O'Shea
Assistant Examiner—Raymond Y. Mah
Attorney, Agent, or Firm—Hill, Steadman & Simpson

[57] ABSTRACT

In a double resonance antenna arrangement for a nuclear magnetic resonance apparatus having at least one conductor section that defines an examination region, a series circuit of a capacitive element and an inductive element is connected in parallel with at least a part of the conductor section.

5 Claims, 2 Drawing Sheets

DOUBLE RESONANCE ANTENNA ARRANGEMENT FOR A NUCLEAR MAGNETIC RESONANCE APPARATUS

BACKGROUND OF THE INVENTION

1. Field of the Invention

The invention is directed to a double resonance antenna arrangement for a nuclear magnetic resonance apparatus having at least one conductor section that defines an examination region.

2. Description of the Prior Art

Nuclear magnetic resonance apparatuses are utilized for imaging as well as for spectroscopy in medical diagnostics. Different operating frequencies are thereby required for the excitation of the atomic nuclei for imaging than for spectroscopy.

The operating frequency given a basic magnetic field of 1.5 T in imaging thus amounts to 64 Mhz, whereas a frequency of 26 Mhz is required for spectroscopy of, for example, phosphorous. Such large differences in the operating frequencies require antenna arrangements having corresponding resonant frequencies. It would be expedient to employ an antenna arrangement that is set or can be set to both operating frequencies.

There are various proposals for a realization of antenna arrangements having two operating frequencies. U.S. Pat. No. 5,038,105 discloses an antenna arrangement wherein a first terminal is provided for a first operating frequency and a second terminal is provided for a second operating frequency. This antenna arrangement thus exhibits different resonant behavior dependent on the terminal via which a transmission signal is supplied or via which a reception signal is taken. A disadvantage of this arrangement is that two terminals are provided, and thus two connecting lines to the antenna arrangement must be laid.

In the antenna arrangement disclosed in European Application 0 256 370, the different operating frequencies are generated via tuning elements controlled from the exterior. Although a common terminal is provided in this known arrangement for all frequencies; however, additional control lines for switching tuning elements are required.

PCT publication WO 90/12 328 discloses a double-tuned resonant "bird cage" antenna arrangement. Bird cage antenna arrangements differ from other antenna arrangements in that a discrete phase distribution must be observed around the circumference of the coil from 0° through 360°. The antenna arrangement disclosed therein has a single terminal for two operating frequencies and has double resonance without switching elements. This is achieved because the individual elements that form the bird cage antenna arrangement behave as a low-pass filter at low frequencies and behave as a high-pass filter at high frequencies. This can be achieved in a band-pass bird cage antenna arrangement as well as in a band rejection bird cage arrangement by adding reactances. A disadvantage of such a bird cage antenna arrangement is that a sufficient uniform antenna characteristic can only be achieved for one of the two operating frequencies.

SUMMARY OF THE INVENTION

An object of the present invention is to provide a double resonance antenna arrangement having sufficient uniformity of the antenna characteristic at both operating frequencies that can be operated without switching elements.

This object is achieved in a double resonant antenna arrangement constructed in accordance with the principles of the present invention wherein a series circuit of a capacitive element and an inductive element is connected in parallel with at least a part of the conductor section which defines the examination region. The antenna arrangement thus forms a double resonance resonant circuit that does not have to be switched for operation with two different frequencies.

Given the operating frequencies coming into consideration of, for example, 64 Mhz/26 MHz (P), 64 MHz/ 17 MHz (Na), 64 MHz /16 MHz ($^{13}$C), 64 MHz/60 MHz (F) given a basic magnetic field having a strength of 1.5 T, the inductive element can be fashioned as a conductor that is arranged essentially parallel to the part of the conductor section.

In one version of the invention, the series circuit is connected to the conductor via an electrical slide contact, so that the length of the part of the conductor section to which the series circuit is connected parallel is variable. The antenna arrangement can thus additionally be varied in frequency.

In a further advantageous version, the conductor section includes at least one variometer. An additional decoupling possibility is thus established.

DESCRIPTION OF THE PREFERRED EMBODIMENTS

Figure 1:
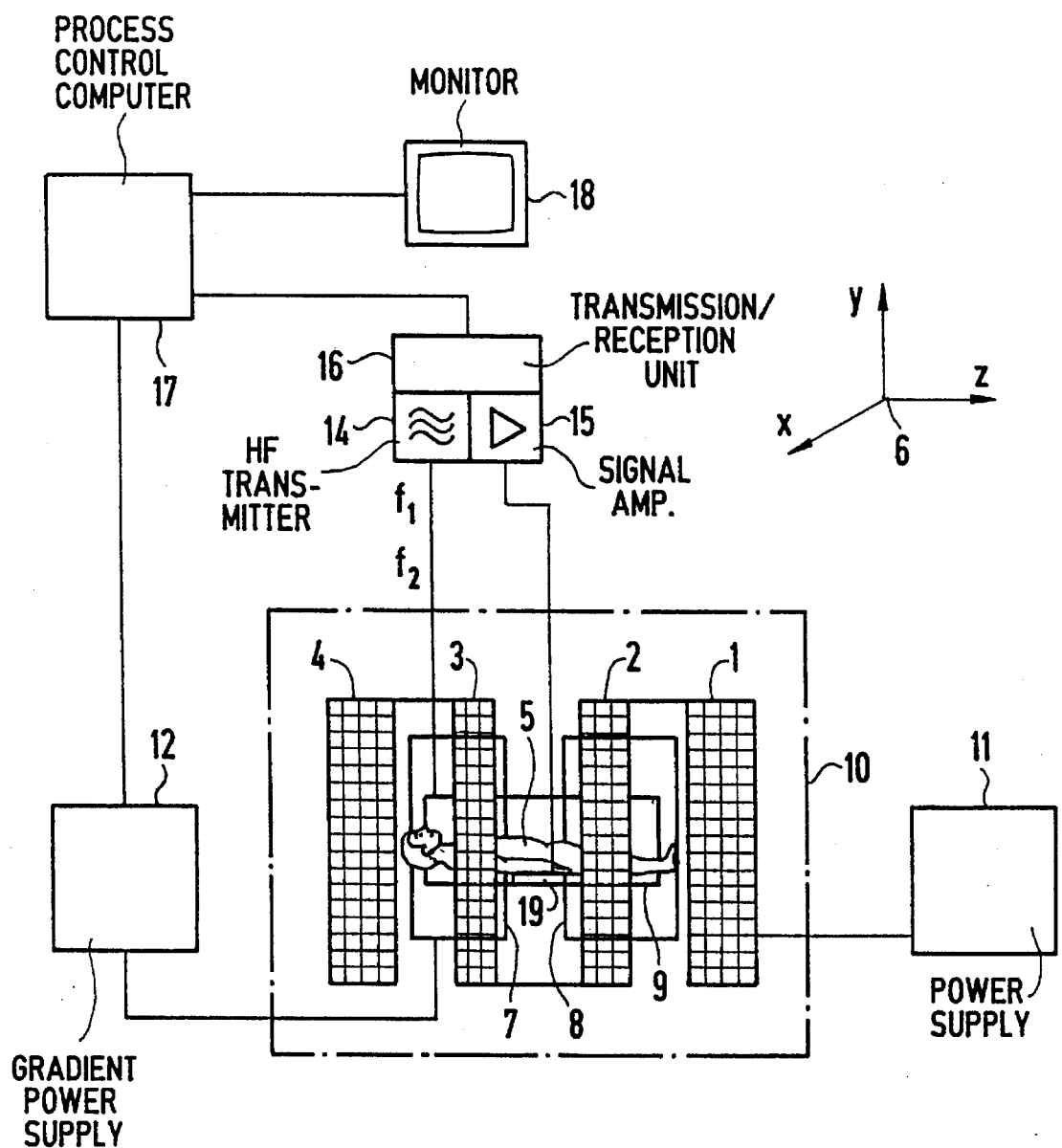
FIG. 1 is a schematic diagram showing the standard structure of a nuclear magnetic resonance apparatus for imaging and for spectroscopy.

In the schematic structure of a nuclear magnetic resonance apparatus shown in FIG. 1 for calculating images and spectra of an examination subject, coils 1, 2, 3 and 4 are employed to generate a basic magnetic field $B_0$ in which— for medical application—the body 5 of a patient to be examined is located. The basic field $B_0$ also has gradient coils allocated to it that are provided for generating independent, mutually perpendicular magnetic field gradients in the x, y and z directions of a Cartesian coordinate system 6. For clarity, only gradient coils 7 and 8 are shown in FIG. 1 which, together with a pair of identical gradient coils lying opposite thereto, serve the purpose of generating a gradient in the x-direction. Identical gradient coils (not shown) for generating a gradient in the y-direction lie parallel to and above and below the body 5. Gradient coils for the gradient field in the z-direction lie at the foot end and head ends of the body 5 oriented transversely relative to the longitudinal axis thereof. The arrangement also contains a whole body antenna 9 serving the purpose of generating magnetic resonance signals. A local antenna 19 is also provided for picking up the nuclear magnetic resonance signals, which can be utilized for exciting the nuclear magnetic resonance signals alternatively to the whole body antenna 9.

The actual examination instrument is composed of the coils 1, 2, 3, 4, 7 and 8 bounded by a dot-dash line 10 as well as the whole body antenna 9 and/or the local antenna 19. A power supply 11 is provided for the operation of the coils 1–4. The gradient coils 7 and 8 as well as other gradient coils that are not shown are connected to at a gradient power supply 12. A high-frequency transmitter 14 that is controlled by a process control computer 17, and which can generate two operating frequencies of, for example, $f_1=26$ Mhz and $f_2=64$ Mhz, is connected to the whole body antenna 9. The local antenna 19 is coupled to the process control computer 17 via a signal amplifier 15, as is the whole body antenna 9. A monitor 18 is connected to the process control computer 17 for displaying an image or data of the spectrum. The components 14 and 15 form a transmission/reception unit 16 for signal generating and signal pick-up.

Figure 2:
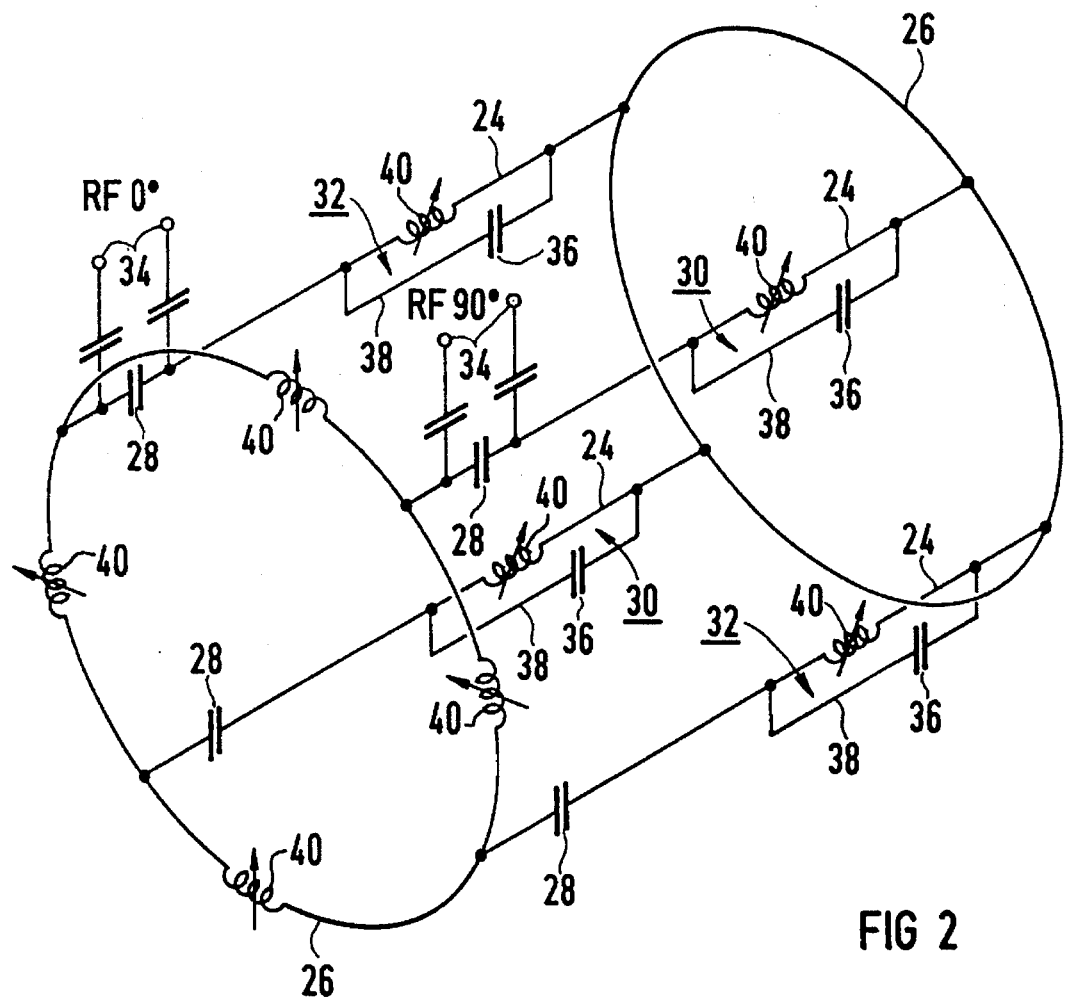
FIG. 2 illustrates a double resonance antenna arrangement constructed in accordance with the principles of the present invention implemented as a circularly polarizing antenna.

The double resonance antenna arrangement 22 shown in FIG. 2 is suitable—based on its fundamental structure and leaving the dimensions out of consideration—for employment as a whole body antenna 9 as well as a local antenna 19, for example for examinations of the head. The double resonance antenna arrangement 22, which is shown in the embodiment of FIG. 2 as a circularly polarizing antenna arrangement, departs from a single resonance arrangement as disclosed by U.S. Pat. No. 4,506,224. Four identical conductor sections 24 are arranged in the axial direction on a cylindrical jacket. The conductor sections 24 have an identical spacing from one another, so that two conductor sections 24 respectively limit ¼ of the cylindrical jacket. One end of each conductor section 24 is connected to a circular conductor 26 in direct electrically conductive fashion. The other ends of the conductor sections 24 are respectively electrically conductively connected to a second circular conductor 26 via a capacitor 28. The conductor sections 24, including the circular conductors 26, bound and thus define an examination region.

Two pairs conductor sections 24 arranged lying opposite one another respectively form sub-antennas 30 and 32, these being rotated by 90° relative to one another. In a transmission mode, given a feed of the sub-antennas 30 and 32 with transmission signals that are respectively phase-shifted by 90°, a circularly polarized, high-frequency magnetic field can be generated in the examination region. Conversely, a better signal-to-noise ratio in the reception mode can be achieved after a 90° phase shift of the received signals relative to one another and after subsequent addition.

In the circularly polarizing antenna arrangement 22, two terminals 34 are provided for the signals phase-shifted by 90° but no further terminals are provided for signals having different operating frequencies. Each sub-antenna 30 and 32 has only a single terminal 34, even though both sub-antennas 30 and 32 have double resonance.

The double resonance property of the antenna arrangement 22 is achieved in that a part of each conductor section 24 has a series circuit of a capacitive element 36 and an inductive element 38 connected in parallel with it. The inductive elements 38 are composed of essentially straight conductors that are respectively arranged parallel to the conductor section 24. Each conductor section 24 together with the capacitor 28 and the series circuit thus forms a double resonance resonant circuit having the resonant frequencies $f_1$ and $f_2$. At the lower resonant frequency $f_1$, the series circuit of the capacitive element 36 and the inductive element 38 is so high-impedance that the conductor section 24, functioning essentially as an inductance, forms a resonant circuit with the capacitor 28. At the higher resonant frequency $f_2$, the series circuit of the capacitive element 36 and the inductive element 38 forms a series resonant circuit, so that, given the frequency $f_2$, the capacitor enters into resonance with the series circuit of elements 36 and 38 and that part of the conductor section 24 not bridged by the series circuit of elements 36 and 38.

For magnetically decoupling the two sub-antennas 30 and 32 from one another, a variometer 40 is inserted in the bridged portion of each conductor section 24 and in every section of the circular conductor 26. The respective inductances of the corresponding conductor sections 24 and sections of the circular conductor 26 can be varied with the variometers 40.

Figure 3:
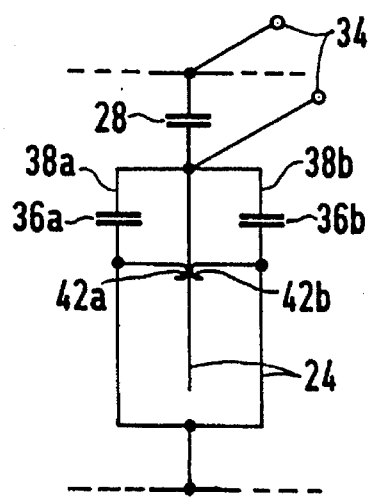
FIG. 3 illustrates an embodiment of a slide contact for varying the length of the conductor section for use in the double resonance antenna arrangement of the invention.

When the conductor sections 24 are each equipped with a slider contact—as forth below with reference to FIG. 3—then the length of each conductor section 24, and thus the inductance thereof, can be set for tuning to the lower operating frequencies. The series circuit of the capacitive element 36 and inductive element 38 recited in FIG. 2 is subdivided into two parallel series circuits, each of which is composed of a capacitive element 36a or 36b and an inductive element 38a or 38b. The advantage of the division into two series circuits arranged parallel to the conductor section is that a large coverage angle is achieved on the cylindrical jacket, whereby the magnetic field of the conductor section 24 can penetrate the parallel circuit well at the same time. If one wished to implement the same coverage angle using a single, broad interconnect of the inductive element 38 without a parallel circuit, the field of the conductor section 24 would be degraded by eddy currents in this interconnect. The capacitors 36a and 36b each have one side connected to a slider contact 42a and 42b with which the length of the conductor section 24 can be set. A part of the conductor section 24 is likewise replaced by parallel circuits for improved field penetration.

Although further modifications and changes may be suggested by those skilled in the art, it is the intention of the inventors to embody within the patent warranted hereon all changes and modifications as reasonably and properly come within the scope of their contribution to the art.

I claim as my invention:

1. A double resonance antenna arrangement having a lower resonant frequency and a higher resonant frequency, for use in a nuclear magnetic resonance apparatus, said double resonance antenna arrangement comprising:

at least one conductor section which defined an examination region;

a series circuit including a capacitive element and an inductive element, said series circuit connected in parallel with at least a portion of said conductor section;

said inductive element comprising a substantially straight conductor disposed substantially parallel to said portion of said conductor section; and said series circuit having a high impedance at the lower resonant frequency and forming a resonant circuit at the higher resonant frequency.

2. A double resonance antenna arrangement as claimed in claim 1, further comprising an electrical slider contact connecting said series circuit to said conductor section for permitting a length of said portion of said conductor section in parallel with said series circuit to be varied.

3. A double resonance antenna arrangement as claimed in claim 1, wherein said conductor section includes at least one variometer.

4. A double resonance antenna arrangement as claimed in claim 1, comprising a plurality of said conductor sections, all of said conductor sections being identical and forming, in combination, a cylindrical jacket with said conductor sections having identical axial spacings from each other, and further comprising and end conductor disposed at an end of said examination region to which all of said conductor sections are connected.

5. A double resonance antenna arrangement as claimed in claim 4, further comprising a plurality of capacitors respectively connected between an end of each conductor section and said end conductor.

* * * * *